United States Patent
Van Stralen et al.

(10) Patent No.: US 7,650,853 B2
(45) Date of Patent: Jan. 26, 2010

(54) DEVICE FOR APPLYING ELECTROMAGNETIC MICROWAVE RADIATION IN A PLASMA CAVITY

(75) Inventors: Mattheus Jacobus Nicolaas Van Stralen, Tilburg (NL); Dennis Robert Simons, Eindhoven (NL)

(73) Assignee: Draka Fibre Technology B.V., Eindhoven (NL)

( * ) Notice: Subject to any disclaimer, the term of this patent is extended or adjusted under 35 U.S.C. 154(b) by 0 days.

(21) Appl. No.: 10/307,975

(22) Filed: Dec. 3, 2002

(65) Prior Publication Data
US 2003/0159781 A1 Aug. 28, 2003

(30) Foreign Application Priority Data
Dec. 4, 2001 (NL) .................................. 1019484

(51) Int. Cl.
*C23C 16/00* (2006.01)
*C23F 1/00* (2006.01)
*H01L 21/306* (2006.01)

(52) U.S. Cl. .................. 118/723 MW; 156/345.36; 156/345.41

(58) Field of Classification Search ......... 118/723 MW, 118/723 ME, 723 MA, 723 MR; 156/345.36, 156/345.41, 345.42
See application file for complete search history.

(56) References Cited

U.S. PATENT DOCUMENTS

| | | | | |
|---|---|---|---|---|
| 4,259,561 A | * | 3/1981 | Roussy et al. | ............... 219/693 |
| 4,883,570 A | * | 11/1989 | Efthimion et al. | ........... 204/164 |
| 5,059,928 A | * | 10/1991 | Mourier et al. | ........... 333/21 R |
| 5,433,789 A | * | 7/1995 | Kakehi et al. | ....... 118/723 MW |
| 6,087,614 A | | 7/2000 | Nakase et al. | |
| 6,158,383 A | | 12/2000 | Otsubo et al. | |
| 6,198,224 B1 | | 3/2001 | Aschermann et al. | |
| 2003/0104139 A1 | * | 6/2003 | House et al. | ................ 427/569 |

FOREIGN PATENT DOCUMENTS

| WO | WO 97/25837 | * | 7/1997 |
|---|---|---|---|
| WO | WO 99 35304 | | 7/1999 |
| WO | WO 99/35304 | * | 7/1999 |

OTHER PUBLICATIONS

The International Search Report issued by the European Patent Office on May 12, 2004 for PCT/NL02/00785.

* cited by examiner

*Primary Examiner*—Parviz Hassanzadeh
*Assistant Examiner*—Rakesh K Dhingra
(74) *Attorney, Agent, or Firm*—Smith Gambrell & Russell LLP

(57) ABSTRACT

A device for applying, in use, electromagnetic microwave radiation in a plasma cavity. The device includes a plasma cavity present within a housing, being substantially cylindrically symmetric about a first axis, and which plasma cavity includes a cylindrical wall provided with a circumferential slit. The plasma cavity is in communication, via the slit, with a first end of an elongated microwave guide having a longitudinally extending second axis. The device is in communication in use with a microwave generating device via the other end of the microwave guide, in which the electromagnetic microwave radiation being generated may include several modes, where the device can, in use, generate microwave radiation in the slit, which microwave radiation has only one electromagnetic field distribution at least in one direction perpendicularly to the propagation direction of the microwave radiation in the microwave guide.

13 Claims, 3 Drawing Sheets

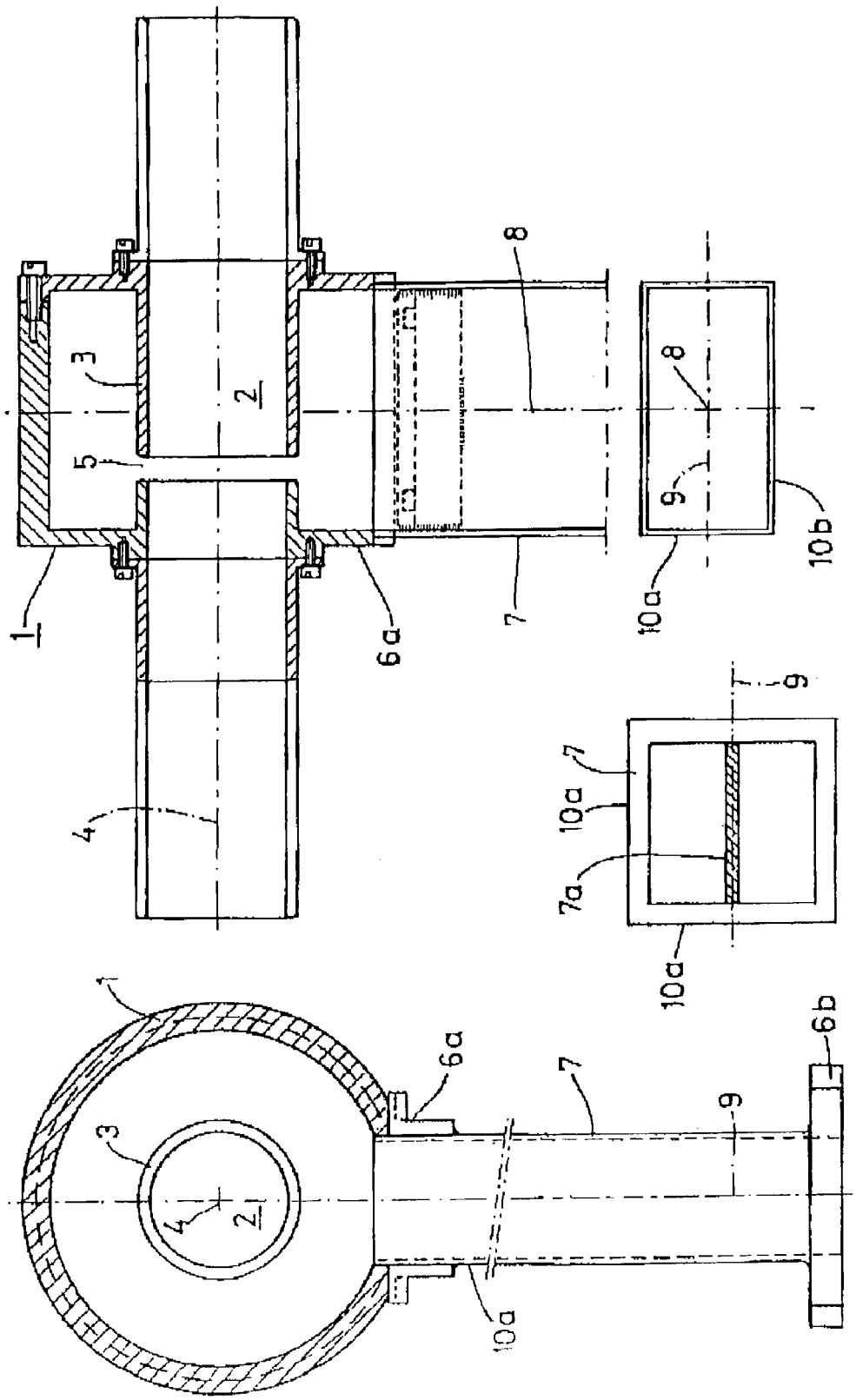

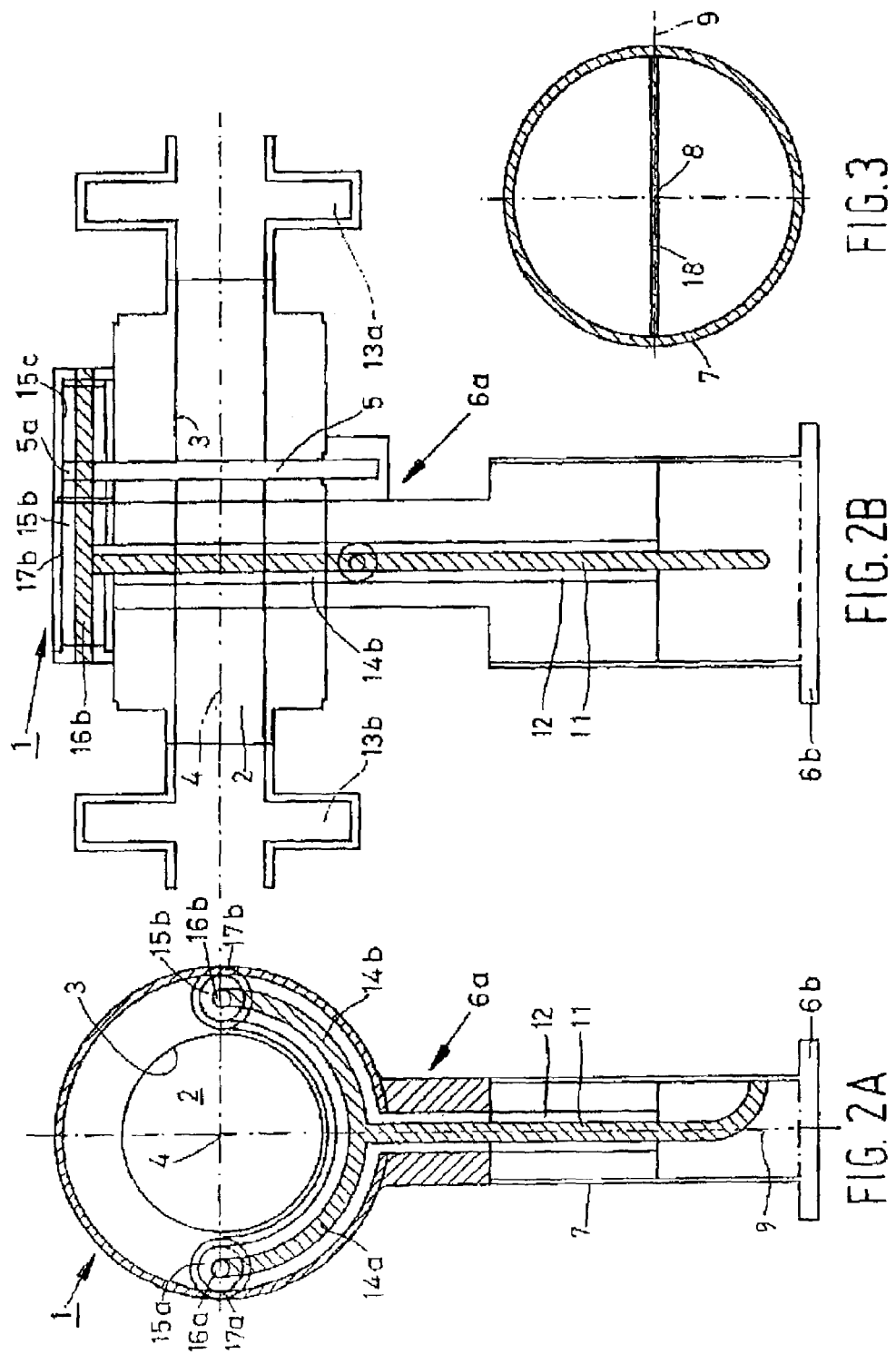

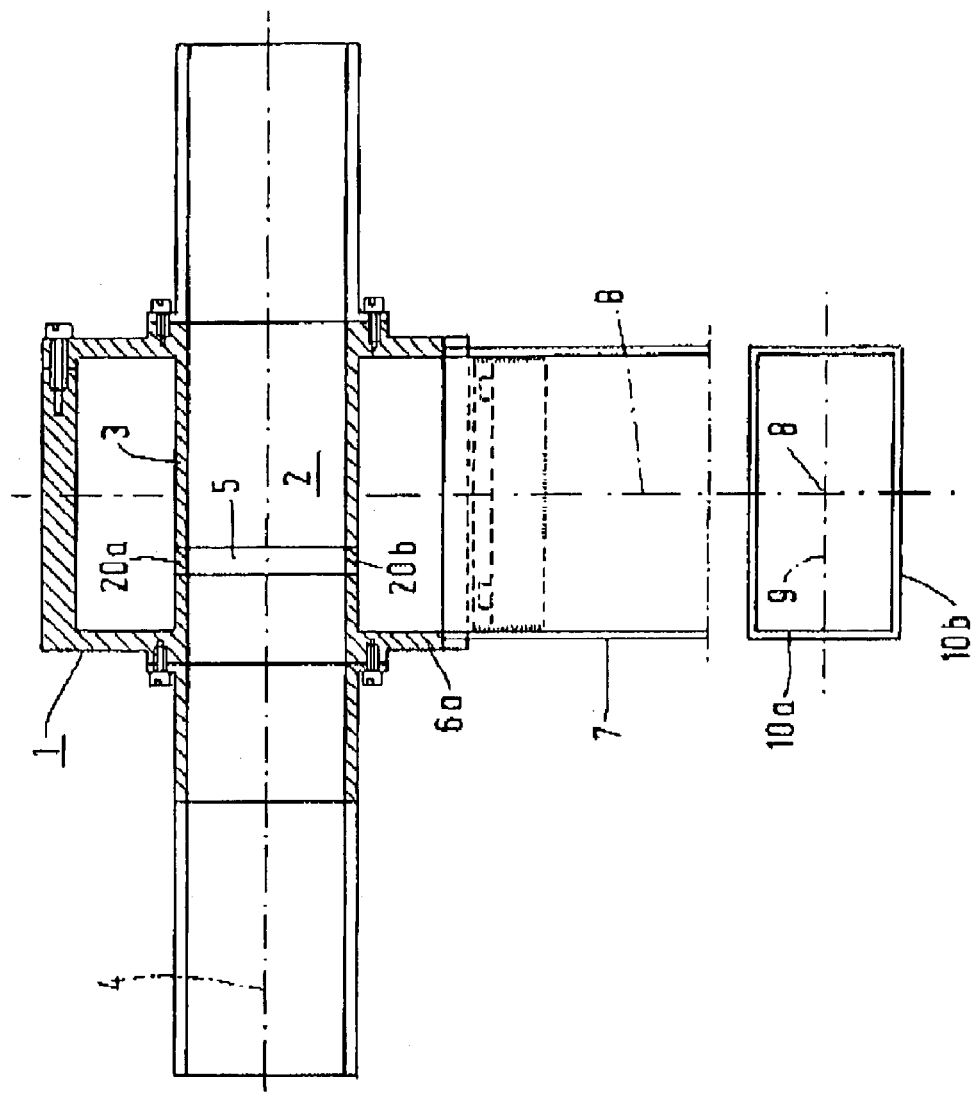
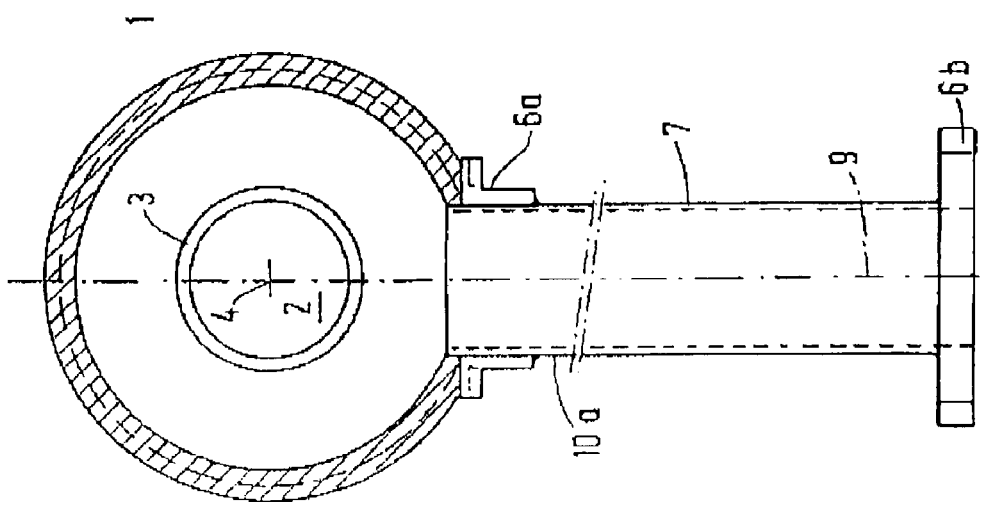

DEVICE FOR APPLYING ELECTROMAGNETIC MICROWAVE RADIATION IN A PLASMA CAVITY

DESCRIPTION

BACKGROUND OF THE INVENTION

1. Field of the Invention

The invention relates to a device for applying, in use, electromagnetic microwave radiation in a plasma cavity, which plasma cavity is present within a housing, being substantially cylindrically symmetric about a first axis, and which comprises a cylindrical wall provided with a circumferential slit, said plasma cavity being in communication, via said slit, with a first end of an elongated microwave guide having a longitudinally extending second axis, said device being in communication in use with microwave generating means via the other end of said microwave guide, in which the electromagnetic microwave radiation being generated may comprise several modes.

The invention also relates to an apparatus for depositing, by means of a Plasma Chemical Vapour Deposition process, one or more glass layers on the inner side of a hollow glass tube disposed in the plasma cavity of the device according to the invention.

The invention furthermore relates to a method for depositing, by means of a Plasma Chemical Vapour Deposition process, one or more glass layers on the inner side of a hollow glass tube disposed in the plasma cavity of the device according to the invention.

2. Discussion of the Background

Such a device, which is also referred to by the technical term microwave applicator, the slit being called a radial wave duct, can be used in particular with a sufra guide or a sufraton for generating a plasma in the plasma cavity. Another practical application of a microwave applicator according to the introduction is disclosed in International patent application PCT/EP98/07798, published under No. WO 99/35304 in the name of the present applicant.

WO 99/35304 shows a PCVD (Plasma Chemical Vapour Deposition) apparatus, in which a hollow cylindrical glass tube is accommodated in the plasma cavity of the microwave applicator, through which tube a gaseous mixture comprising $O_2$, $SiCl_4$ and $GeCl_2$ for example, is passed. The microwave radiation applied in the slit by the microwave applicator locally generates a plasma in the hollow glass tube. By moving the microwave applicator back and forth with respect to the glass tube—possibly with simultaneously rotation of the tube—glass layers, whether or not of different composition, can be deposited on the inner side of the cylindrical glass tube by means of the plasma. In this way a so-called hollow preform having one or more glass layers deposited on the inner side thereof is obtained. The preform is subjected to a collapsing treatment so as to obtain a massive rod, from which an optical fibre is subsequently drawn, which fibre is intended for telecommunication purposes, for example.

In the PCVD application, the microwave radiation being used or being applied in the slit has a frequency of 890 MHz or 2.45 GHz and may comprise several so-called modes. The term modes as used herein is understood to mean the propagating modes in the radial propagation direction as well as the modes that have just been cut off. The propagating modes comprises a number of zero-axis crossings in the electrical field in both directions perpendicularly to the radial propagation direction.

If the width of the radial wave slit amounts less than half the wavelength of the microwave radiation being used, only one propagating mode will occur if the inner circumference of the radial wave slit has a length equal to or smaller than the wavelength of the microwave radiation being used, whilst three propagating modes will occur if the inner circumference of the radial wave slit has a length of 1-2 wavelengths of the microwave radiation being used.

It is very difficult with the current applications to determine which modes the microwave radiation being applied in the slit (radial wave duct) comprises. If the microwave radiation applied in the plasma cavity or the radial wave duct comprises several modes, the geometric properties of the plasma generated in the plasma cavity will not be known very exactly. If said modes exhibit the same electromagnetic field distribution, seen in the direction of rotation relative to the first axis, the geometric property of the applied microwave radiation and thus also of the generated plasma in the aforesaid direction of rotation will be clearly defined. Said plasma properties depend, among other things, on the excitation ratio of the modes, and a small change in the environment (temperature, pressure, etc) may lead to a different excitation ratio, causing the geometric properties of the plasma to change. All this may lead to an undesirable geometry of the plasma, amongst other things, or cause the plasma to become unstable or become extinguished altogether.

In particular in the case of PCVD applications such phenomena affect the composition and the structure of the glass layers being deposited on the inner side of the hollow glass tube, as well as the final quality of the optical fibre drawn from a preform thus obtained.

One solution for the problem of the modes of the microwave radiation applied in the plasma cavity and the unpredictable properties of the generated plasma can be found in the maximum allowable internal diameter of the radial wave duct, in which the inner circumference is smaller than or equal to the wavelength of the microwave radiation being used, this in order to prevent the occurrence of several modes. However, said maximum constructional dimension will also limit the maximum allowable external diameter of the preform to be manufactured in that case, as well as the length of the optical fibre drawn from said preform.

SUMMARY OF THE INVENTION

The object of the invention is to obviate the above drawbacks and to provide a microwave applicator by means of which a stable plasma having the aforesaid advantageous geometric properties can be generated and maintained on the one hand and which furthermore does not have any restrictions as regards its constructional dimensions.

In order to accomplish that objective, the microwave applicator is according to the invention characterized in that the device comprises means which, in use, generate microwave radiation in the slit, which microwave radiation has only one electromagnetic field distribution at least in one direction perpendicularly to the propagation direction. Since the field distribution properties of the electromagnetic microwave radiation no longer constitute an unknown and unpredictable factor, a more stable plasma having desired geometric properties in the aforesaid direction is thus generated in the plasma cavity.

In a specific embodiment, the microwave radiation in the slit comprises only one mode. Since only one mode exists in the slit, a stable plasma is thus generated. Not only does the microwave applicator thus have a much broader range of applications, but it furthermore makes it possible to control the deposition of glass layers on the inner side of a hollow glass tube much better, in particular in the case of PCVD applications, so that eventually a higher quality optical fibre can be drawn from the preform thus obtained.

In addition to that, the use of the microwave applicator is no longer restricted by its constructional dimensions, as a result of which in particular the dimensions of the plasma cavity can be increased, so that also larger-diameter preforms can be worked and obtained in the case of PCVD applications.

More in particular, the microwave radiation has only one specific electromagnetic field distribution, seen in the direction of rotation relative to the first axis or in a direction parallel to the first axis. In addition to that, the two axes can form a plane of symmetry for the device and orient the microwave radiation relative to the plane of symmetry of the device.

In a specific embodiment, said means form part of the microwave guide.

In a specific embodiment of the device according to the invention, the microwave guide is to that end of rectangular cross-section, with the short walls of the microwave guide extending perpendicularly to the plane of symmetry. From the viewpoint of symmetry, it has appeared that this construction of the microwave applicator directly excludes a number of modes and only passes microwave radiation of one mode.

In another embodiment, the microwave guide is of circular cross-section or of square cross-section.

All embodiments may comprise a metal partition disposed in the plane of symmetry, which partition divides the microwave guide into two chambers. The fact that microwave radiation comprising only one mode is passed whilst other modes are excluded has proved to be effective in these embodiments, too.

Another embodiment, in which microwave radiation comprising only one mode is generated in the plasma cavity, is according to the invention characterized in that the microwave guide is a coaxial guide comprising a rod portion extending along the second axis and a cylindrically symmetric guide tube extending round said rod portion.

In a specific embodiment, in order to obtain symmetric control of the plasma cavity, the microwave guide splits near its first end into an even number of supply guides present within the housing, which terminate in the slit.

In order to obtain simultaneous excitation of the plasma cavity, it is desirable that the difference in length between the paths of the microwave radiation propagating through the two supply guides equals $n \cdot \frac{1}{2} \cdot \lambda_g$, with $n \in \{0, 1, 2, \ldots\}$ and $\lambda_g$ being the wavelength of the microwave radiation in the microwave guide. In a specific, simple and inexpensive construction, the supply guides are symmetrically arranged with respect to the plane of symmetry.

More in particular, each supply guide comprises a coaxial bore extending parallel to the first axis in the housing and terminating in the slit, with the cylindrical wall of the coaxial bore possibly coinciding with the external cylindrical wall of the slit.

In suitable, functional embodiments of the device according to the invention, the slit in the cylindrical wall extends along part of the circumference or along the entire circumference thereof.

The invention also relates to an apparatus for depositing, by means of Plasma Chemical Vapour Deposition, one or more layers of silica on the inner side of a hollow glass tube which is disposed in the plasma cavity of the device according to the invention.

BRIEF DESCRIPTION OF THE DRAWINGS.

The invention will be explained in more detail with reference to the drawings, in which:

FIGS. 1A-1C show a first and a second embodiment of a microwave applicator according to the invention;

FIG. 2A-2B shows another embodiment of a microwave applicator according to the invention;

FIG. 3 shows another embodiment of a microwave applicator according to the invention; and FIGS. 4A-4B show yet another embodiment of a microwave applicator according to the invention.

In FIGS. 1A-1C a first embodiment of a microwave applicator according to the invention is shown.

DETAILED DESCRIPTION OF THE PREFERRED EMBODIMENTS.

The microwave applicator comprises a housing 1 in which a plasma cavity 2 is present, which plasma cavity 2 is circularly symmetric about a first axis of symmetry 4. The plasma cavity 2 has a cylindrical wall 3, which is provided with a slit 5 along its entire circumference in this embodiment, which slit functions as a radial wave duct.

The housing 1 is connected to a first side 6a of an elongated wave guide 7, in such a manner that the radial wave duct 5 is in communication with the wave guide 7. The wave guide 7 has a longitudinally extending axis 8.

A hollow cylindrical glass tube can be accommodated within the cylindrical, elongated plasma cavity 2 in the case of Plasma Chemical Vapour Deposition, through which tube a gaseous mixture comprising $O_2$, $SiCl_4$ and $GeCl_2$, for example, can be passed.

Since the elongated waveguide 7 is connected to microwave generating means (not shown) with its other end 6b, electromagnetic microwave radiation can be applied in the plasma cavity 2 via the elongated waveguide 7 and the radial wave duct 5, in which plasma cavity a plasma is generated in the hollow glass tube. By moving the microwave applicator back and forth with respect to the glass tube—with possible simultaneous rotation of the tube—glass layers, whether or not of different composition, can be deposited on the inner side of the cylindrical glass tube by means of said plasma. In this way a so-called hollow preform having one or more glass layers deposited on the inner side thereof is obtained, which preform is subjected to a collapsing treatment so as to obtain a massive rod from which an optical fibre is drawn, which fibre is intended for telecommunication purposes, for example.

Since electromagnetic microwave radiation may comprise various modes with the associated various electromagnetic field distributions, the geometric properties of the plasma generated in the plasma cavity 2 are not known very exactly. Desirably, in particular in the case of the PCVD application, the plasma generated in the plasma cavity 2 is not only rotationally symmetric to the desired extent but stable as well, so as to create conditions favourable for the deposition of glass layers on the inner side of the hollow cylindrical glass tube.

The plasma that has been generated in the plasma cavity 2 may become unstable or even become extinguished altogether, in particular due to minor changes in the environment (temperature, pressure, etc).

According to the invention, in order to generate a stable plasma having the desired geometry in the plasma cavity 2, microwave radiation is generated in the slit, which microwave radiation has only one specific electromagnetic field distribution in one direction perpendicularly to the propagation direction.

In the embodiment as shown in FIGS. 1A and 1B, the elongated microwave guide 7 is to that end rectangular in shape with short walls 10a and long walls 10b. In order to obtain microwave radiation comprising the specific mode that is known in advance in the plasma cavity 2, the short side 10a extends perpendicularly to the plane of symmetry 9 of the device in this embodiment, which plane of symmetry 9 is formed by the longitudinal axis 8 of the waveguide 7 and a cylindrical axis 4 of the plasma cavity 2. The plane of symmetry 9 defined by the two axes 4 and 8 functions as the plane of symmetry for the entire device.

The rectangular construction of the elongated waveguide 7 and the orientation thereof with respect to the plane of symmetry 9 of the overall device orients the microwave radiation propagating through the elongated waveguide 7, in such a manner that the microwave radiation in the plasma cavity 2 comprises only one electromagnetic field distribution at least in one direction perpendicularly to the propagation direction.

Another embodiment of such a waveguide 7 is shown in FIG. 1C, in which the waveguide is shown to be of square cross-section, with sides 10a of identical length. In order to orient the microwave radiation propagating through the waveguide 7 in such a manner that microwave radiation having only one electromagnetic field distribution is generated in the plasma cavity 2 in this embodiment as well, the elongated waveguide 7 is divided into two sections by means of a metal partition 7a, which metal partition 7a is positioned exactly in the plane of symmetry 9 of the device. The metal partition 7a functions as an electrical barrier for the microwave radiation propagating through the waveguide 7, and consequently it orients said microwave radiation in such a manner that the radiation in the plasma cavity 2 has only one electromagnetic field distribution at least in one direction perpendicularly to the propagation direction.

FIGS. 2A and 2B show another embodiment of the microwave applicator according to the invention, in which a co-axial waveguide is used rather than a rectangular or square waveguide 7. To that end, a cylindrically symmetric guide tube extending about the axis of symmetry 8 is used as the microwave guide, in which case a rod portion 11 is arranged in and along the axis of symmetry 8.

Near the first end 6a (the transition between the waveguide 7 and the housing 1 or the plasma cavity 2), the coaxial waveguide is split into two supply guides 14a and 14b arranged within the housing 1, which are preferably disposed symmetrically with respect to the plane of symmetry 9 in the housing 1. Each supply guide 14a, 14b comprises a respective co-axial bore 17a, 17b comprising a respective guide tube 15a, 15b containing a respective elongated rod portion 16a, 16b. The two bores 17a and 17b extend parallel to the axis 4 as well as to each other, and they terminate in the radial wave duct 5, as is shown in FIG. 2B. In order to achieve a symmetric control of the radial wave duct 5, so as to generate a homogeneous and symmetric plasma in the plasma cavity 2, the cylindrical wall 15c of each respective coaxial bore 17a, 17b coincides with the external cylindrical wall 5a (see FIG. 2B) of the radial wave duct 5.

In this embodiment, two chokes 13a and 13b may furthermore be arranged in the housing 1, which chokes are positioned on either side of the radial wave duct 5. The use of chokes on either side of the radial wave duct 5 has a number of advantages, among which a more efficient enclosure of the generated plasma in a direction parallel to the cylindrical axis 4 and a reduction of the leakage of microwave radiation from the plasma cavity 2 to the outside, thus diminishing any health hazards for the operators.

Another embodiment is shown in FIG. 3, in which the waveguide 7 is of cylindrical section. In order to generate microwave radiation having only one specific electromagnetic field distribution in this embodiment as well, the cylindrical waveguide is split, similarly to the embodiment of FIG. 1C, by means of a metal partition 18 which divides the cylindrical waveguide 7 into two sections. The metal partition 18, which functions as an electrical barrier for the electromagnetic microwave radiation propagating through the waveguide 7 in this embodiment, lies in the plane of symmetry 9 as defined by the axis 8 and the axis 4 in the plasma cavity 2.

Although only the splitting into two supply guides 14a and 14b of the microwave guide according to the embodiment as shown in FIGS. 2A and 2B is described herein, this technical feature can be used without any problem with any type of microwave guide, such as rectangular, square and even cylindrical microwave guides as shown in FIGS. 1A-1C and 3. Although the microwave guide of FIGS. 2A and 2B is furthermore split into two supply guides, the microwave applicator can be extended by splitting up the microwave guide into any even number of supply guides, which all terminate in the slit (radial wave duct).

It should furthermore be noted that also elliptical microwave guides can be used without any problem in one or more of the embodiments that are described herein.

FIGS. 4A and 4B show another embodiment of a microwave applicator according to the invention. This embodiment corresponds in large measure to the embodiments of FIGS. 1A-1C, so that like parts are indicated by the same reference numeral for a better understanding of the Figure.

This microwave applicator, too, comprises a housing 1 with a plasma cavity 2 present therein, which plasma cavity 2 is circularly symmetric about a first axis of symmetry 4. The plasma cavity 2 comprises a cylindrical wall 3 which, in this embodiment, is provided with a slit 5 which does not extend along the entire circumference thereof, which slit functions as a radial wave duct.

The circular slit 5 is interrupted in at least one place, on the other hand; in this embodiment it is interrupted in two places, which are indicated at 20a and 20b. Said places 20a and 20b, in which the wall 3 of the circularly symmetric plasma cavity 2 normally continues, lie in the plane of symmetry 9, so as to enable the device according to the invention to function correctly.

The invention claimed is:

1. A device for applying, in use, electromagnetic microwave radiation in a plasma cavity, said device comprising said plasma cavity present within a housing, the cavity being substantially cylindrically symmetric about a first axis, and which plasma cavity comprises a cylindrical wall provided with a circumferential slit, said plasma cavity being in communication, via said slit, with a first end of an elongated microwave guide having a longitudinally extending second axis, said device being in communication in use with microwave generating means via the other end of said microwave guide, in which the electromagnetic microwave radiation being generated may comprise several modes, wherein the device comprises means which, in use, generate microwave radiation in the slit, which microwave radiation has only one electromagnetic field distribution in only one direction perpendicularly to the propagation direction of the microwave radiation in the microwave guide, wherein the microwave radiation has only one specific electromagnetic field distribution, seen in the direction of rotation relative to the first axis;

wherein the two axes form a plane of symmetry for the device such that the microwave radiation is oriented relative to the plane of symmetry;

wherein the microwave guide exhibits rectangular cross-section, with the short walls of the microwave guide extending perpendicularly to the plane of symmetry.

2. A device according to claim 1, wherein said means form part of the microwave guide.

3. A device according to claim 2, wherein the microwave guide splits up near the first end in an even number of supply guides present within the housing, which supply guides terminate in the slit.

4. A device according to claim 3, wherein the microwave guide is composed of two supply guides and that the difference in length between the paths of the microwave radiation propagating through the two supply guides equals $n*½*1_g$, with $n \in (0, 1, 2, \ldots)$ and $1_g$ being the wavelength of the microwave radiation in the microwave guide.

5. A device according to claim 3, wherein the supply guides are symmetrically arranged with respect to the plane of symmetry.

6. A device according to claim 1, wherein a metal partition is disposed in the plane of symmetry, which partition divides the microwave guide into two chambers.

7. A device according to claim 1, wherein said slit extends along part of the circumference of the cylindrical wall.

8. A device according to claim 1, wherein said slit extends along the entire circumference of the cylindrical wall.

9. An apparatus for depositing, by means of a Plasma Chemical Vapour Deposition process, one or more of glass layers on the inner side of a hollow glass tube disposed in the plasma cavity of a device according to claim 1.

10. A device for applying electromagnetic microwave radiation, said device comprising:

a housing;

a plasma cavity provided within said housing, said plasma cavity including a cylindrical wall provided with a circumferential slit, said plasma cavity being substantially cylindrically symmetric about a first axis;

an elongated microwave guide having a first end in communication with said plasma cavity via said slit, said elongated microwave guide having a longitudinally extending second axis extending from said first end to a second end, said second end being configured to receive electromagnetic microwave radiation having several modes, wherein the first axis and the second axis form a plane of symmetry for the device such that the microwave radiation is oriented relative to the plane of symmetry, said elongated microwave guide having a substantially rectangular cross-section with two short walls and two long walls, said two short walls of said microwave guide extending perpendicularly to said plane of symmetry; and means for applying in said plasma cavity only one mode of the electromagnetic microwave radiation, the one mode having only one electromagnetic field distribution, the one electromagnetic field distribution being in a direction perpendicular to a propagation direction of the electromagnetic microwave radiation in said elongated microwave guide.

11. The device according to claim 10, wherein the one electromagnetic field distribution is seen in a direction of rotation relative to said first axis.

12. The device according to claim 10, wherein the one electromagnetic field distribution is seen in a direction parallel to said first axis.

13. A device for applying electromagnetic microwave radiation, said device comprising:

a housing;

a plasma cavity provided within said housing, said plasma cavity including a cylindrical wall provided with a circumferential slit extending along the entire circumference of the cylindrical wall, said plasma cavity being substantially cylindrically symmetric about a first axis;

an elongated microwave guide having a first end in communication with said plasma cavity via said slit, said elongated microwave guide having a longitudinally extending second axis extending from said first end to a second end, said second end being configured to receive electromagnetic microwave radiation having several modes, wherein the first axis and the second axis form a plane of symmetry for the device such that the microwave radiation is oriented relative to the plane of symmetry, said elongated microwave guide having a substantially rectangular cross-section with two short walls and two long walls, the two short walls of the microwave guide extending perpendicularly to the plane of symmetry; and means for applying in said plasma cavity only one mode of the electromagnetic microwave radiation, the one mode having only one electromagnetic field distribution, the one electromagnetic field distribution being in a direction perpendicular to a propagation direction of the electromagnetic microwave radiation in said elongated microwave guide.

\* \* \* \* \*